United States Patent [19]
Chesneau

[11] Patent Number: 5,731,771
[45] Date of Patent: Mar. 24, 1998

[54] CIRCUIT FOR LOCKING A SIGNAL TO A REFERENCE VALUE

[75] Inventor: David Chesneau, Meylan, France

[73] Assignee: SGS-Thomson Microelectronics S.A., Saint Genis, France

[21] Appl. No.: 561,522

[22] Filed: Nov. 21, 1995

[30] Foreign Application Priority Data

Nov. 25, 1994 [FR] France ................................ 94 14414

[51] Int. Cl.$^6$ ...................................................... H04N 5/18
[52] U.S. Cl. ........................ 341/118; 348/697; 341/155
[58] Field of Search ................................... 341/118, 155; 348/572, 689, 691, 696, 697

[56] References Cited

U.S. PATENT DOCUMENTS

| | | | |
|---|---|---|---|
| 4,811,016 | 3/1989 | Millward et al. | 341/126 |
| 4,859,871 | 8/1989 | Kobayashi et al. | 307/264 |
| 5,483,295 | 1/1996 | Kim et al. | 348/695 |
| 5,532,758 | 7/1996 | Honma | 348/694 |

OTHER PUBLICATIONS

French Search Report from French Patent Application 94 14414, filed Nov. 25, 1994.
Patent Abstracts of Japan, vol. 015, No. 165 (E-1061), Apr. 25, 1991 & JP-A-03 035666 Mitsubishi Electric Corp.
Patent Abstracts of Japan, vol. 011, No. 046 (E-479), Feb. 12, 1987 & JP-A-61 210770 Hitachi Ltd.

*Primary Examiner*—Marc S. Hoff
*Attorney, Agent, or Firm*—Wolf, Greenfield & Sacks, P.C.; James H. Morris

[57] ABSTRACT

The present invention relates to a circuit for locking an analog signal to a reference value, including an analog-to-digital converter receiving the analog signal modified by the charge stored in a capacitor. A digital comparator receives the output of the converter and a reference digital value, and controls capacitor charging and discharging sources. A memory point is a stability condition flag for inhibiting the charging and discharging of the capacitor. A circuit for analyzing the converter output activates the flag when the successive values of the converter output meet a predetermined stability condition, and deactivates the flag when the successive values of the converter output meet a predetermined divergence condition.

21 Claims, 3 Drawing Sheets

CIRCUIT FOR LOCKING A SIGNAL TO A REFERENCE VALUE

BACKGROUND OF THE INVENTION

1. Field of the Invention

The present invention relates to circuit for locking a signal to a d.c. reference value during successive time intervals so as to regularly restore a basic level of the signal. The present invention more specifically relates to such a control circuit allowing, in a television set, restoration of the black level of a chrominance or luminance signal after the line fly-back.

2. Discussion of the Related Art

FIG. 1 shows a conventional circuit for locking a luminance or chrominance signal to the black level. The unlocked signal V is applied to the input of an amplifier 10 via a capacitor C. The signal Vc at the input of amplifier 10 corresponds to the signal to be locked to the black level. Said signal Vc, amplified by amplifier 10, is most of the time converted into a digital signal by an analog-to-digital converter 12. A digital comparator 14 receives on an input A the digital output N of converter 12 and on an input B a reference digital value Nref. The terminal of capacitor C, from which the locked signal Vc is taken, is connected to a high supply potential Vdd by a charging current source Ic, and to the ground GND by a discharging current source Id. The charging source Ic is activated by a signal UP issued by comparator 14 when the value N is lower than Nref. The source Id is activated by a signal DN issued by comparator 14 when the value N is higher than Nref. The source Ic or Id is activated at the rate of a clock CK provided to comparator 14 and converter 12.

With this configuration, when the value N is higher than Nref, for instance, the source Id is activated and progressively discharges capacitor C. The voltage Vc decreases, and the signal N follows the evolution of the voltage Vc. When the signal N has reached Nref, none of the sources Ic or Id is activated, and the voltage Vc remains at the value reached.

This circuit is only used during line fly-back; the current sources Ic and Id are deactivated for the duration of the lines.

During a locking phase, the voltage V is assumed to be constant. In practice, this voltage V includes noise caused by various surrounding parasitic phenomena. The noise is directly transmitted by capacitor C and amplifier 10 to the input of converter 12 and can cause an alteration of the digital signal N. The noise, which is random and has a mean value equal to zero, is not a nuisance in an open loop, that is, outside the locking phases.

However, during the locking phases, the circuit performs a correction of the signal N at each clock cycle according to the value of the signal N found at the previous cycle. Thus, for instance, if a parasitic pulse of voltage Vc causes an increase of the value N, the circuit performs, at the next cycle, a negative correction on voltage Vc, even if said voltage Vc is simultaneously submitted to a negative parasitic pulse: the negative correction and the negative parasitic pulse cumulate and increase the error on the value N, rather than decrease it. Such cumulative errors have a non negligible probability of occurring and cause an oscillation of the signal N with an amplitude of several units. While a one unit oscillation is normal and tolerable, an oscillation of several units becomes apparent on the television screen and deteriorates the image quality.

Additionally, the converter 12 generally used in such a circuit is a converter which has a reaction time of several clock cycles CK, often three, between the time when a sample of the input signal of the converter is acquired and the time when the digital value of this sample is supplied by the converter. Thus, a charging or discharging current is applied to capacitor C during all these reaction cycles. If the value N only differs from Nref by one unit, the voltage Vc could reach the desired value during the first of the following reaction cycles. If this occurs, the correction nevertheless continues to be performed during the remaining reaction cycles, which draws the value Vc away from the desired value again. As the control is desirably performed quickly, relatively high charge and discharge currents are being used. Thus, this drawing away of the voltage Vc is likely to be sufficient to alter the value N in the wrong direction. There also results an oscillation of the signal N (and of the value Vc) with an amplitude which can become apparent on the television screen.

SUMMARY OF THE INVENTION

An object of the present invention is to provide a circuit for locking a signal on a reference value, which has reduced sensitivity to noise.

Another object of the present invention is to provide such a circuit which does not start oscillating because of the reaction time of an analog-to-digital converter.

These objects are achieved in a circuit for locking an analog signal to a reference value, including an analog-to-digital converter receiving the analog signal modified by the charge stored in a capacitor. A digital comparator receives the output of the converter and a reference digital value, and controls capacitor charging and discharging sources. A memory point represents a stability condition flag for inhibiting the capacitor charging and discharging. A circuit for analyzing the converter output activates the flag when the successive values of the converter output meet a predetermined stability condition, and deactivates the flag when the successive values of the converter output meet a predetermined divergence condition.

According to an embodiment of the present invention, the circuit includes a window detector, which is active when the converter output is in the vicinity of the reference value, so as to reduce the amount of capacitor charging or discharging.

According to an embodiment of the present invention, the reduced amount of charging or discharging is such that the converter output varies by no more than one unit from a value to a following or successive value.

According to an embodiment of the present invention, the circuit includes a drift detector in order to apply a reduced amount of charging or discharging when the successive values of the converter output meet a predetermined drift condition and during the active time of said flag.

According to an embodiment of the present invention, the window of the window detector is delimited by the reference value increased by one and the reference value decreased by one.

According to an embodiment of the present invention, the stability condition corresponds to two consecutive values equal to the reference value, and the divergence condition corresponds to four consecutive values higher or lower than the reference value.

According to an embodiment of the present invention, the drift condition corresponds to three consecutive values higher or lower than the reference value, with the possibility that the second value among the three values is equal to the reference value.

The foregoing and other objects, features and advantages of the present invention will be discussed in the following description of specific embodiments, taken in conjunction with the accompanying drawings but not limited by them.

DETAILED DESCRIPTION

Figure 1:
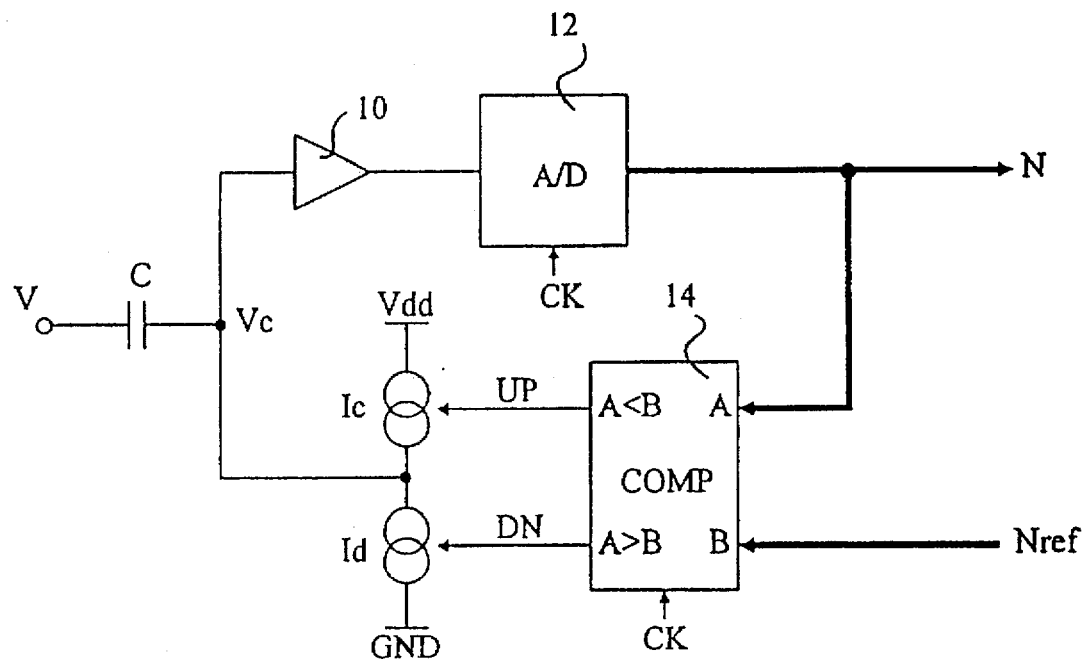
FIG. 1, which has been previously described, shows a conventional circuit for locking a chrominance or luminance signal to the black level in a television set.
Figure 2:
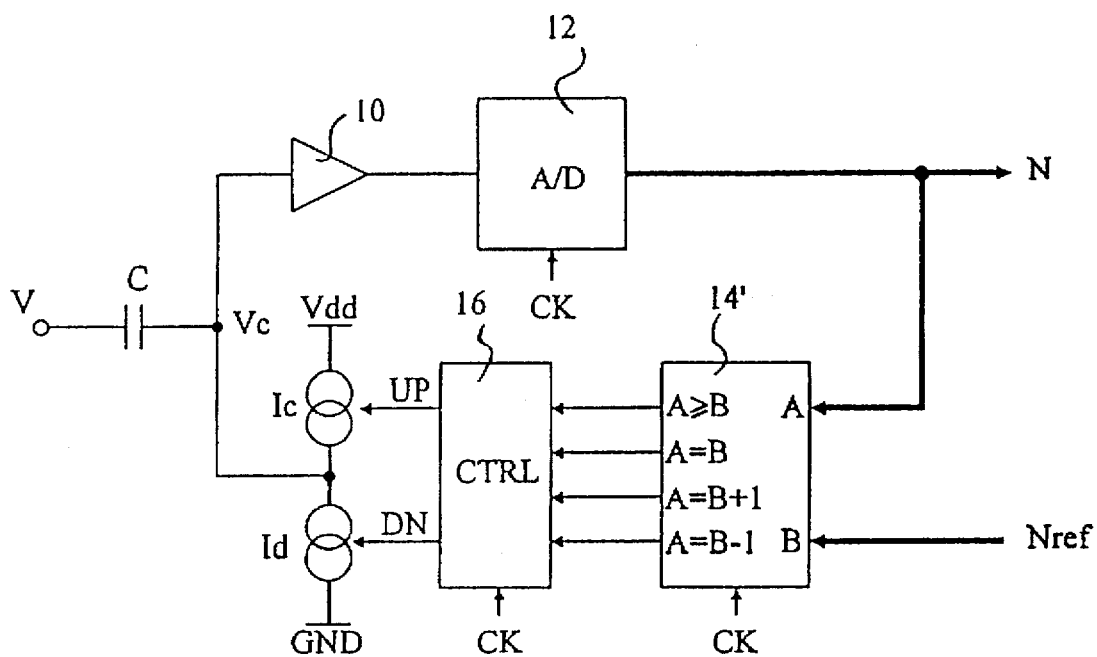
FIG. 2 shows an architecture of a locking circuit according to the present invention.

FIG. 2 shows some elements that are the same as in FIG. 1, referred to by the same reference numerals. The comparator 14 of FIG. 1 is replaced by a comparator 14' supplying, for example, an A≧B signal active if the value N is higher than or equal to Nref and an A=B signal active if the value N is equal to Nref. As an alternative, the comparator 14' further supplies an A=B+1 signal active if the value N is equal to Nref+1, and an A=B−1 signal active if the value N is equal to Nref−1. These four signals are supplied, according to the invention, to a control circuit 16 which analyses these signals and controls the current sources Ic and Id (by means of the signals UP and DN) in the manner described hereafter.

As a summary, according to a first embodiment, the circuit of FIG. 2 initially functions as that of FIG. 1, as long as the control circuit 16 detects a difference between the values N and Nref. As soon as the signal N settles on Nref, the control circuit 16 enters a locked mode where the sources Ic and Id are no longer activated. In this case, even if the signal Vc or N varies randomly due to the noise, the circuit performs no correction which could make the signals Vc and N oscillate.

Of course, a correction must be performed if the signal Vc starts diverging, which could translate a discharging of capacitor C through a resistor or a parasitic influence. This divergence could also be caused by a normal variation of the unlocked voltage V. In fact, the control circuit 16 analyses the successive values of the outputs A≧B and A=B of comparator 14' in order to detect a divergence condition. If such a divergence condition is detected, the control circuit 16 switches to the unlocked mode and the errors are corrected again as in the circuit of FIG. 1.

According to a second embodiment, the outputs A=B+1 and A=B−1 of comparator 14' are used by the control circuit 16 to perform a fine correction when the value N is in the vicinity of Nref (between Nref−1 and Nref+1). Thus, the circuit has a fast convergence mode when the signal N is distant from Nref, and a fine convergence mode when the signal N differs from Nref by a unit. The fine correction is chosen to be small enough for the signal N not to vary during the reaction cycles of converter 12, which avoids oscillations of the signal Vc or N. As an alternative, this fine correction is further used when the control circuit 16, being in its locked mode, detects a low drift condition insufficient for switching modes.

Figure 3:
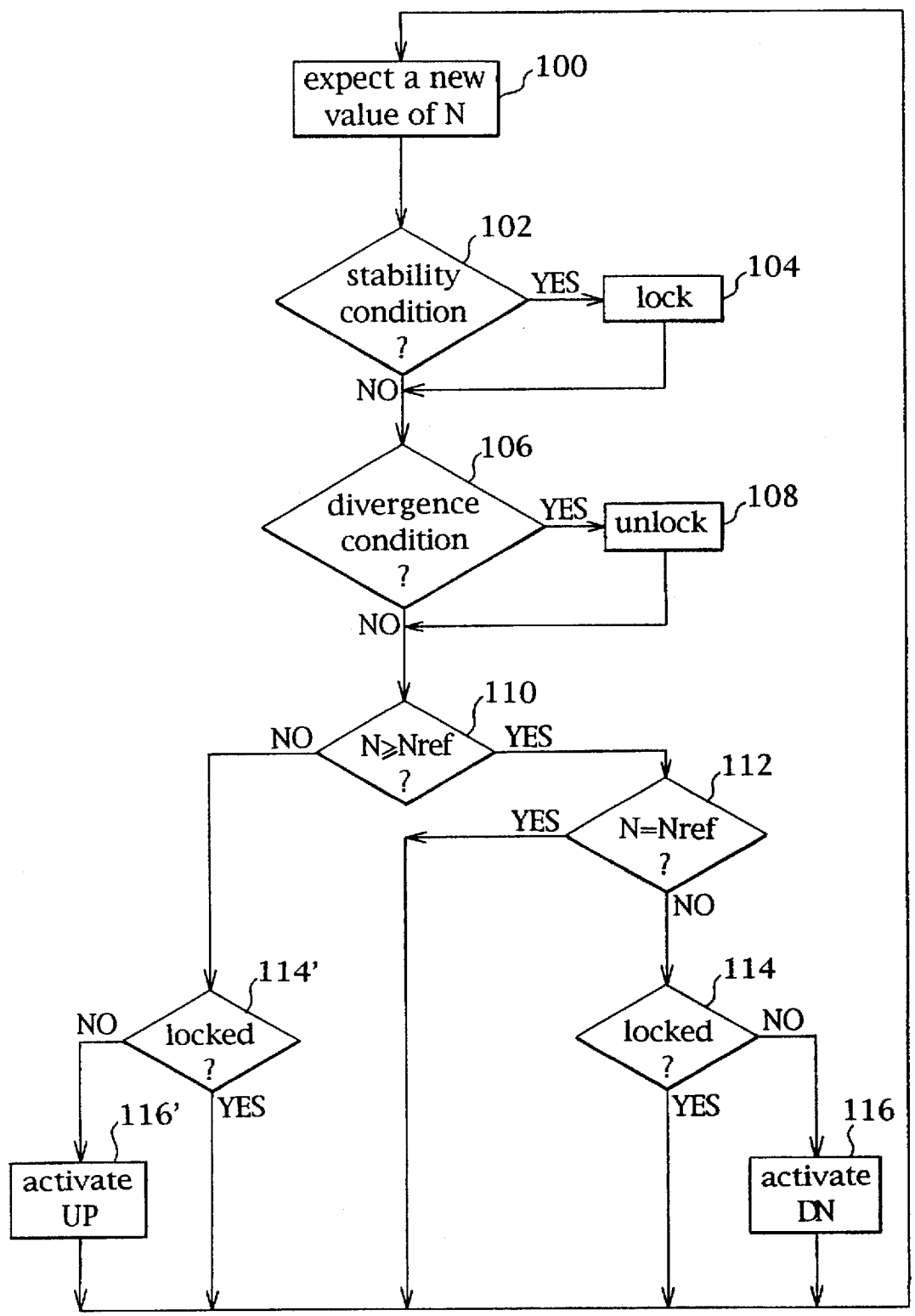
FIG. 3 shows a block diagram illustrating the operation of the circuit of FIG. 2 according to a first embodiment.

FIG. 3 shows a block diagram illustrating more in detail the operation of the control circuit 16 according to the first embodiment. In the block diagrams described hereafter, a paragraph describing a block starts with the block reference number.

100. A new value of the signal N is expected.

102. The last values of N are analyzed in order to determine if they meet a stability condition. This stability condition is met, for instance, if the last two values of N are equal to Nref. In practice, the values of the A=B output of comparator 14' are analyzed, and not the values of N. In order to do this, for example, the A=B signal supplies a 2 bit shift register, which is validated for each new value N. Thus, if the two bits of the shift register are on 1, the stability condition is met.

104. If the stability condition is met, the circuit enters a locked mode indicated, for example, by a flag corresponding to the state of a memory point (a flip-flop).

106. The last values of N are analyzed in order to determine if they meet a divergence condition. This condition is met, for instance, if the last four values of N are either all Greater or all smaller than Nref. In order to do this, in practice, the last four pairs of signals (A≧B, A=B) of comparator 14' are analyzed. The divergence condition is met if the four pairs are all equal to (1,0) or to (0,0). The A≧B and A=B signals are supplied, for instance, to respective 4 bit shift registers, which are validated for each new value N. The shift register associated with the A=B signal is also used to perform the analysis of the stability condition in block 102.

108. If the divergence condition is met, the circuit enters the unlocked mode by no longer validating the flag which had been validated in block 104.

110. A checking of whether the value N is higher than or equal to Nref is performed, which amounts to checking if the A≧B signal is on 1.

112. In case of a positive result, a checking of whether the value N is equal to Nref is performed, which amounts to checking if the A=B signal is on 1. If it is so, the situation is an optimum stability situation and the circuit expects a new value N at block 100.

114. The value N is strictly higher than Nref. A checking of whether the circuit is in the locked mode is performed. In case of a positive result, the value N is slightly higher than Nref and the difference is only a parasitic phenomenon which does not require correcting. The circuit expects a new value N at block 100.

116. The circuit is not in the locked mode. In this case, the signal N is in a convergence phase and decreases towards Nref, or has reached Nref but starts diverging by increasing. The signal DN is activated during a clock cycle, which causes the discharging of capacitor C by the current of source Id of an amount determined by the current of the source Id, the period of the clock CK, and the value of the capacitance C.

Symmetrical operations are performed if the value N is lower than Nref. In block 114', as in block 114, a check is performed on whether the circuit is locked. In case of a positive result, no correction is performed and a new value N is expected at block 100. In case of a negative result, the signal UP is activated at block 116' during a clock cycle so as to charge capacitor C with a predetermined amount.

The blocks 102 to 108, which are used to put the circuit in the locked or the unlocked mode, have been integrated in the block diagram of FIG. 3. However, the corresponding operations can be performed separately, in parallel with the rest of the operations of the block diagram.

Due to the operating mode just discussed, the control circuit according to the invention does not correct random parasites of the signal Vc or N, once the signal N has reached Nref. The signal Vc or N is corrected again only if it exhibits divergence characteristics (several successive values higher or lower than the desired value).

Figure 4:
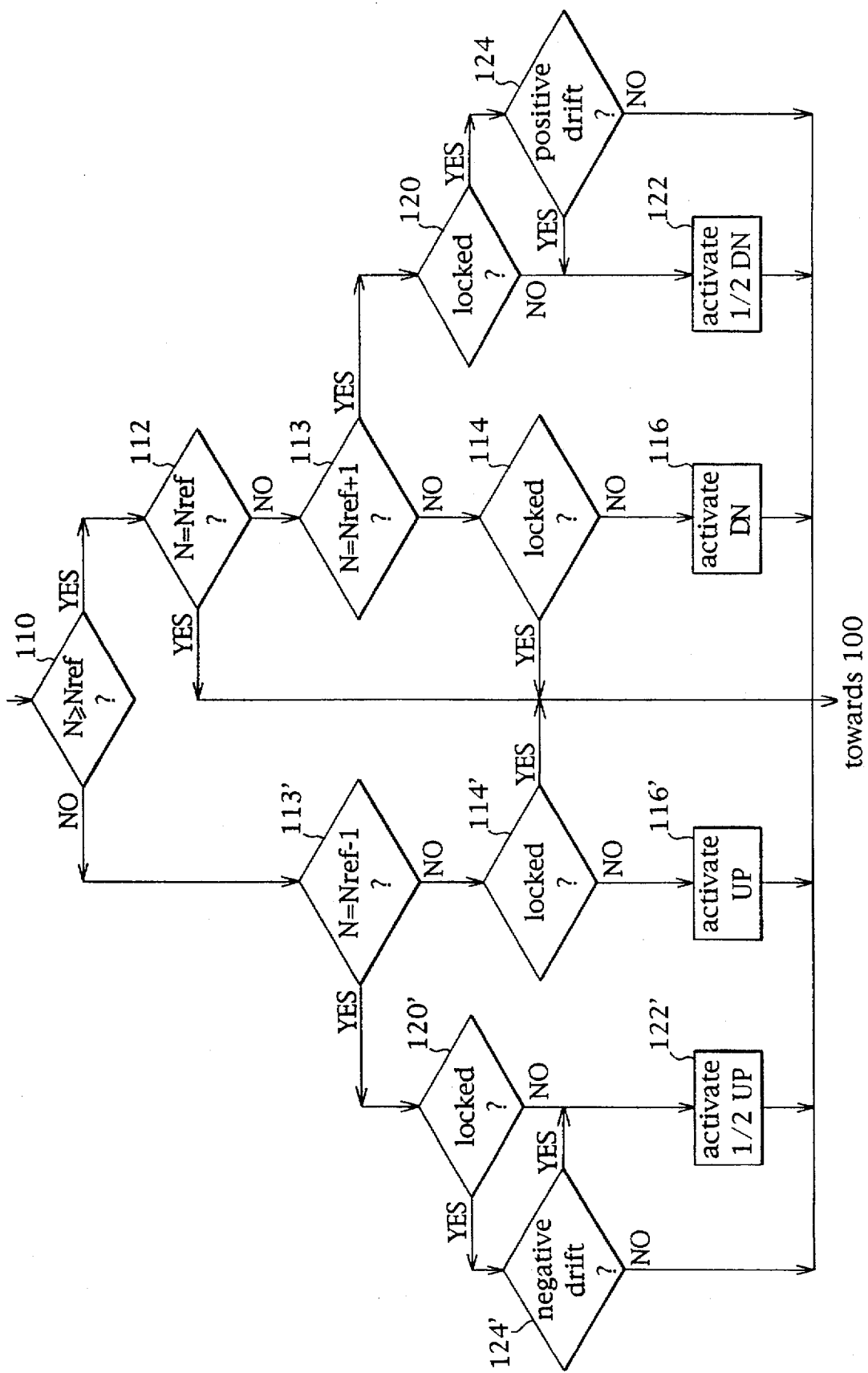
FIG. 4 partially shows a block diagram illustrating the operation of the circuit of FIG. 2 according to another embodiment.

FIG. 4 partially shows a block diagram from the block 110 of the block diagram of FIG. 3, illustrating an optimized operation of the locking circuit according to the invention. This block diagram includes all the blocks of FIG. 3, which will not be described again.

113. This block is interposed between blocks 112 and 114. The value N is strictly higher than Nref and a checking on whether it is equal to Nref+1 is performed. In case of a negative result, the operations continue, as described previously, at block 114 to perform, if necessary, a normal correction.

120. The value N is equal to Nref+1. A checking on whether the circuit is in the locked mode is performed.

122. The circuit is not in the locked mode. At this step, it either means that the signal N is converging by decreasing towards Nref and is in the vicinity of Nref, or that the signal N starts to diverge by increasing. A fine correction is then performed. The capacitor C is discharged by a reduced amount with respect to that of block 116. In order to perform this reduced discharging, for example, the signal DN is only activated during an alternation of the clock CK, that is, during a half period of the clock or even less if the clock duty cycle is chosen to be lower than 0.5. The optimum value of this reduced discharging is such that voltage Vc does not reach a value corresponding to Nref−1 during the reaction cycles of the converter. The oscillations due to excessive corrections performed in the vicinity of Nref are thus suppressed. Besides, a fast convergence is provided by blocks 114 and 116 when the signal N is far from Nref.

124. The circuit is in the locked mode and the value N is equal to Nref+1. A check is performed on whether the last values of N meet a positive drift condition which is not sufficient to trigger the unlocking of the circuit. This drift condition corresponds, for example, to three consecutive values equal to Nref+1, with the possibility for the middle one to be equal to Nref. In case of a positive result, a correction is decided, but a fine correction is performed at block 122. In case of a negative result, no correction is performed and a new value N is expected at block 100.

The operations just described correspond to the correction of values of N greater than Nref. The values of N lower than Nref are corrected in a symmetrical way. Thus, in a block 113', a checking is performed on whether the value N is equal to Nref−1 (which is indicated by the A=B−1 signal of comparator 14'). In case of a negative result, the operations continue at block 114' in the way described in the block diagram of FIG. 3. In case of a positive result, a checking is performed at block 120' on whether the circuit is in the locked mode. If the circuit is in the locked mode, a fine correction is performed at block 122', by increasing the charge of capacitor C by an amount smaller than at block 116'. If the circuit is in the locked mode, a check is performed at block 124' on whether the last values of the signal N meet a negative drift condition. In case of a positive result, a fine correction is performed in block 122', otherwise no correction is performed.

The present invention has mainly been described by means of block diagrams that those skilled in art can easily retranscribe, for example, in VHDL language in order to generate logic circuits performing the desired operations. In addition, the order of the blocks of the block diagrams can be changed without altering the functions described. For instance, block 112 can be positioned before block 110.

Then, in block 110, a check is performed on whether the value N is strictly greater than Nref.

Of course, the present invention is likely to have various alterations and modifications which will readily occur to those skilled in the art. Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A circuit for locking an analog signal to a reference value, including:
    an analog-to-digital converter receiving the analog signal modified by a charge stored in a capacitor;
    a digital comparator receiving an output of the converter and a reference digital value;
    capacitor charging and discharging sources, controlled by the comparator;
    a memory point representing a stability condition flag for inhibiting charging and discharging of the capacitor; and
    a circuit for analyzing the output of the converter, for activating the flag when a sequence of successive values of the output of the converter meets a predetermined stability condition, and for deactivating the flag when the sequence of successive values of the output of the converter meets a predetermined divergence condition.

2. The locking circuit according to claim 1, including a window detector, active when the output of the converter is in the vicinity of the reference value, for reducing an amount of charging or discharging of the capacitor.

3. The locking circuit according to claim 2, wherein the reduced amount of charging or discharging is such that the output of the converter varies by one unit at most from a value to a following value.

4. The locking circuit according to claim 2, including a drift detector for, when successive values of the output of the converter meet a predetermined drift condition and said flag is active, applying a reduced amount of charging or discharging.

5. The locking circuit according to claim 4, wherein the drift condition corresponds to three consecutive values higher or lower than the reference value, with a possibility that the second of these three values is equal to the reference value.

6. The locking circuit according to claim 5, wherein the three consecutive values are each a value in a range from one less than the reference value to one more than the reference value.

7. The locking circuit according to claim 2, wherein a window of the window detector is delimited by the reference value increased by one and by the reference value decreased by one.

8. The locking circuit according to claim 1, wherein the stability condition corresponds to two consecutive values equal to the reference value, and wherein the divergence condition corresponds to four consecutive values higher or lower than the reference value.

9. A method of restoring a black level of a television signal in a television, the method including steps of:
    (a) storing, on a device, a charge proportional to the black level of the television signal;
    (b) sampling a value of the stored charge;

(c) comparing the sampled value to a reference value;

(d) storing, in order, a comparison result for each successive sampled value;

(e) determining when a sequence of stored successive comparison results represents a predetermined stability condition;

(f) determining when a sequence of stored successive comparison results represents a predetermined divergence condition;

(g) reducing, by a first reduction amount, one of an amount of charging of the device and an amount of discharging of the device when the predetermined divergence condition is determined; and (h) repeating steps (a)–(g).

10. The method as recited in claim 9, wherein the device is a capacitor.

11. The method as recited in claim 9, wherein:

step (a) includes a step of digitizing the value of the stored charge; and the reference value is a digitized reference value.

12. The method as recited in claim 9, wherein step (f) includes a step of:

indicating the predetermined divergence condition when four consecutive stored comparison results are each greater than the reference value or when four consecutive comparison results are each less than the reference value.

13. The method as recited in claim 9, wherein step (e) includes a step of:

indicating the predetermined stability condition when two consecutive comparison results are each equal to the reference value.

14. The method as recited in claim 9, further including steps of:

determining when the sequence of successive comparison results represents a drift condition; and reducing, by a second reduction amount less than the first reduction amount, one of an amount of charging of the device and an amount of discharging of the device when the drift condition is detected and the divergence condition is not detected.

15. The method as recited in claim 14, wherein the step of determining the drift condition includes:

indicating the drift condition when three consecutive values are each in a range from the reference value to one unit greater than the reference value.

16. A method of clamping an input signal level to a reference level, the method including steps of:

(a) storing, on a device, a charge proportional to the input signal level;

(b) at a regular time interval, sampling a value of the charge on the device;

(c) comparing the sampled charge value to the reference level;

(d) determining when a sequence of successive sampled charge values represents a predetermined stability condition;

(e) determining when a sequence of successive sampled charge values represents a predetermined divergence condition;

(f) reducing, by a first reduction amount, one of an amount of charging of the device and an amount of discharging of the device when the predetermined divergence condition is determined in step (e); and (g) repeating steps (a)–(f).

17. The method as recited in claim 16, wherein the device is a capacitor.

18. The method as recited in claim 16, wherein step (e) includes a step of:

detecting the predetermined divergence condition when four consecutive sampled charge values are each greater than the reference level or when four consecutive sampled charge values are each less than the reference level.

19. The method as recited in claim 16, wherein step (d) includes a step of: detecting the predetermined stability condition when two consecutive sampled charge values are each equal to the reference level.

20. The method as recited in claim 16, further including steps of:

determining when a plurality of successive sampled charge values represents a drift condition; and reducing, by a second reduction amount less than the first reduction amount, one of an amount of charging of the device and an amount of discharging of the device when the drift condition is detected and the divergence condition is not detected.

21. The method as recited in claim 20, wherein the drift condition determining step includes a step of:

detecting the drift condition when three consecutive sampled charge values are in a range from one less than the reference level to the reference level.

* * * * *